US006188530B1

(12) United States Patent
Katsuragi (10) Patent No.: US 6,188,530 B1
(45) Date of Patent: Feb. 13, 2001

(54) DRIVING APPARATUS

(75) Inventor: Hiroji Katsuragi, Izumi (JP)

(73) Assignee: Minolta Co., Ltd., Osaka (JP)

( * ) Notice: Under 35 U.S.C. 154(b), the term of this patent shall be extended for 0 days.

(21) Appl. No.: 09/393,296

(22) Filed: Sep. 10, 1999

(30) Foreign Application Priority Data

Sep. 11, 1998 (JP) ................................................. 10-258161

(51) Int. Cl.[7] ...................................................... G02B 7/02
(52) U.S. Cl. ........................... 359/824; 359/814; 359/823
(58) Field of Search .................................... 359/813, 814, 359/824, 823

(56) References Cited

U.S. PATENT DOCUMENTS 3,851,651 * 12/1974 Icenbice ................................ 128/422
5,490,015 * 2/1996 Umeyama et al. ................... 359/824
5,589,723 12/1996 Yoshida et al. ...................... 310/328

FOREIGN PATENT DOCUMENTS 05047011  2/1993 (JP) .

* cited by examiner

Primary Examiner—Georgia Epps
Assistant Examiner—Timothy Thompson
(74) Attorney, Agent, or Firm—McDermott, Will & Emery (57) ABSTRACT

A lens driving actuator comprises a lens barrel formed of piezoelectric material, an electrode pair comprising a pair of venetian blind-like electrodes opposed to the interior surface of the lens barrel in the axial direction, and a high frequency wave power source for exciting the electrodes of the electrode pair which are arranged so as to form a waveguide between the electrode pair on the interior surface of the lens barrel such that elastic surface waves travel this waveguide in the axial direction via the excitation of the electrodes of the electrode pair and a lens pressing against the waveguide.

13 Claims, 7 Drawing Sheets

DRIVING APPARATUS

CROSS-REFERENCE TO RELATED APPLICATIONS

This application is based on Patent Application No. HEI 10-258161 filed in Japan, the content of which is hereby incorporated by reference.

BACKGROUND OF THE INVENTION

1. Field of the Invention

The present invention relates to an apparatus for driving a member in a predetermined direction, and specifically relates to an apparatus for driving an optical member such as a lens element and the like along an optical axis.

2. Description of the Related Art

Figure 1:
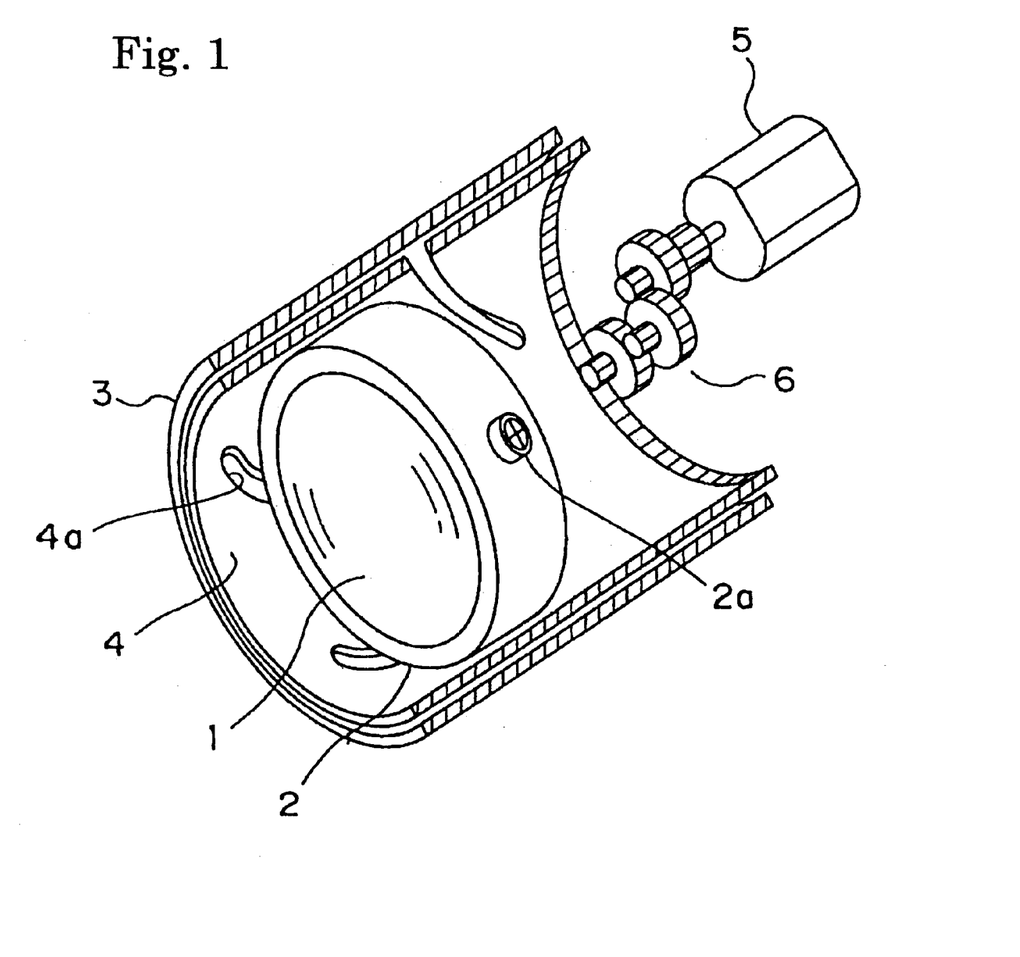
FIG. 1 is a perspective view of a partial cross section of a conventional lens driving apparatus.

In conventional lens devices, a rotation motor is used as a lens drive actuator. For example, as shown in FIG. 1, a widely used method provides a cam pin 2a that protrudes from a lens frame 2 which holds a lens 1, and is inserted in a channel 4a provided on a cam ring 4 and is inserted in a rectilinear channel (not illustrated) provided on the stationary barrel 3, such that the rotation of the rotation motor 5 is transmitted to the cam ring 4 via, a gear train 6 or the like, and rectilinearly drives the lens 1 by means of the rotation of the cam ring 4 relative to the stationary barrel 3.

Figure 2A:
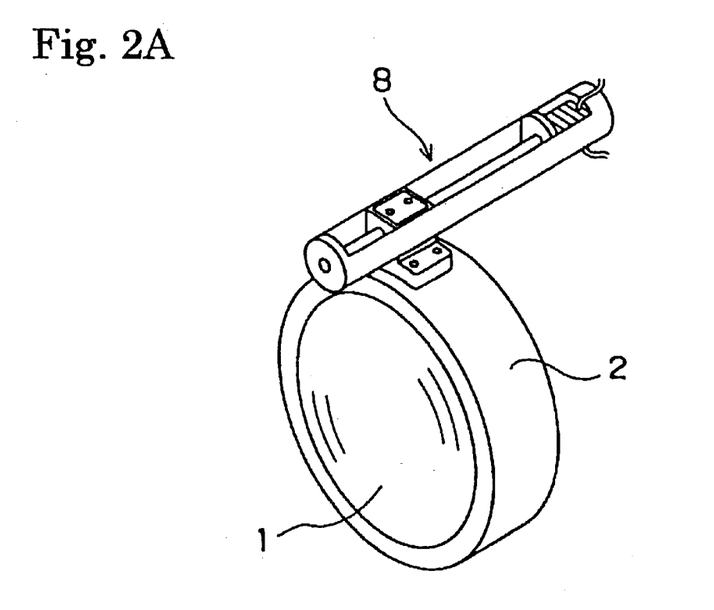
FIGS. 2A and 2B are perspective views of another conventional lens driving actuator.
Figure 2B:
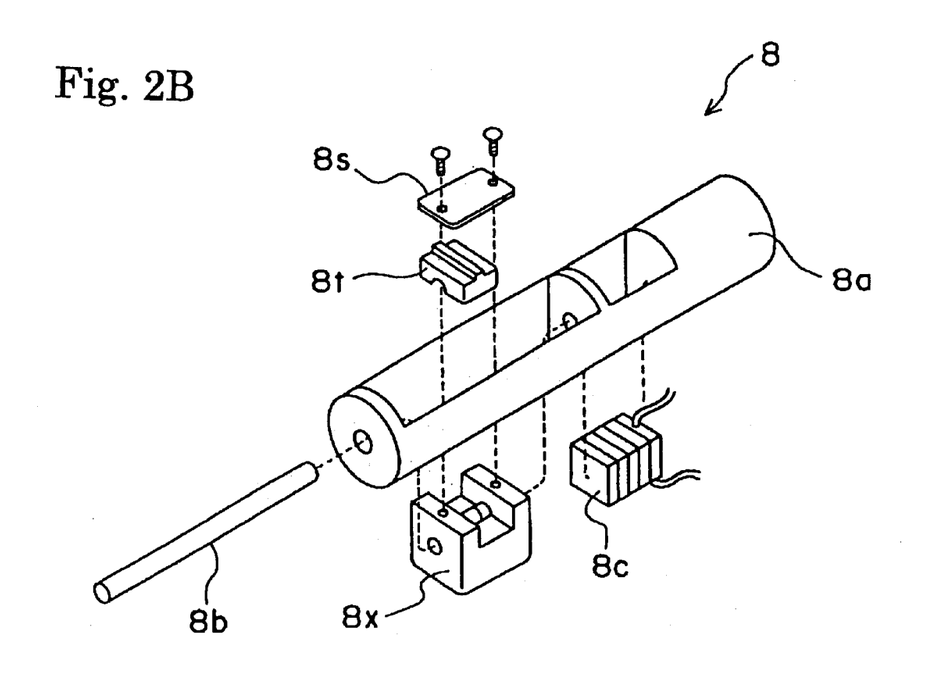

A lens device has been proposed which uses a piezoelectric actuator 8 as a lens driving actuator, as shown in FIGS. 2A and 2B. The piezoelectric actuator 8 comprises a stationary member 8a and a drive rod 8b respectively connected to each end in the expansion/contraction direction of a piezoelectric element 8c which expands/contracts when a voltage of a predetermined waveform is applied thereto, and a slider 8x having a friction member 8t friction bonded to the drive rod 8b via the force exerted by a flat spring 8s, such that the slider 8x is driven along the drive rod 8b which reciprocates in conjunction with the expansion/contraction of the piezoelectric element 8c induced by the application of, for example, a sawtooth-like pulse. The lens frame 2 is connected to the slider 8x.

Lens devices using such lens driving actuators are complex in construction. Furthermore, it is structurally impossible to individually drive a plurality of lenses, and even if such were possible, the construction would be of excessively greater complexity, and the cost would increase.

SUMMARY OF THE INVENTION

The present invention provides a driving apparatus of simple construction capable of driving an optical member such as a lens element and the like and eliminates the previously described disadvantages.

The present invention providing an actuator using an elastic surface wave generated in the surface layer in the interior of a lens barrel formed of piezoelectric material as a lens drive source, and basically characterized by the integration of the actuator and the lens barrel.

The lens driving actuator of the present invention has a simple construction for individually driving a plurality of lens elements comprising a lens system, and is therefore inexpensive from a cost perspective. Specifically, the lens driving actuator has the following construction.

The lens driving actuator comprises a lens barrel formed of piezoelectric material, an electrode pair comprising a pair of venetian blind-like electrodes opposed to the interior surface of the lens barrel in the axial direction, and a high frequency wave power source for exciting the electrodes of the electrode pair which are arranged so as to form a waveguide between the electrode pair on the interior surface of the lens barrel such that elastic surface waves travel this waveguide in the axial direction via the excitation of the electrodes of the electrode pair. The lens is constructed so as to be movable by pressing against the waveguide.

In then aforesaid construction, when the power source excites via a high frequency wave, an elastic surface wave is generated in the interior surface of the lens barrel and advances along the axial direction forming a waveguide between the pair of electrodes in the interior surface of the lens barrel. The lens pressing against this waveguide is driven along the waveguide in the direction of propagation of the elastic surface wave by the friction force via a drive principle similar to that of an ultrasonic wave motor using a flexible wave as a traveling wave.

According to this construction, the lens is driven simply via the construction of pressing against the a movable lens barrel, thereby rendering unnecessary the components of complex shape such as the stationary barrel and cam ring, and the piezoelectric actuator having a friction member and the like.

It is desirable that the lens is constructed so as to be pressed against the waveguide using engagement, spring force, or elasticity.

According to the aforesaid construction, the lens can be held using a constant pressure force pressing against the waveguide. Accordingly, the lens can be driven with stability.

It is desirable that electrode pairs of two or more electrodes are provided to form a plurality of waveguides. A single lens may press against a plurality of waveguides.

According to the aforesaid construction, the lens is driven via a plurality of parts pressing against the waveguide. Accordingly, the lens can be driven with excellent balance so as to not cause tilting of the lens.

It is desirable that electrodes pairs of two or more electrodes are provided. When only one lens is pressed against one waveguide between electrode pairs, the high frequency wave power source may simultaneously or selectively excite the electrodes of two or more electrode pairs so as to individually drive two or more lenses.

According to the aforesaid construction, since only one lens presses against the waveguide between one electrode pair and the other lens does not press against the waveguide, it is possible to drive only one lens if an electrode of one electrode pair is excited.

It is desirable that the piezoelectric material have a polycrystalline structure.

According to the aforesaid construction, the lens barrel is easily manufactured using a material having a polycrystalline structure, e.g., lead-zirconate-titanate, as the piezoelectric material.

The electrode pairs may be arranged staggered in the circumferential direction rather than arranging the electrode pairs opposite the axial direction, such that the elastic surface wave propagated in the axial direction from one electrode does not reach the other electrode. In this instance, if a lens is pressed against the waveguide formed by the respective electrodes, it is possible to reciprocatingly drive the lens. Furthermore, if the lens is pressed against the waveguide of at least one electrode, the lens can be driven in at least one direction. As an alternative to constructing the entirety of the lens barrel of piezoelectric material, if at least the waveguide part of the lens barrel is formed of piezoelectric material, it is possible to drive the lens pressed against the waveguide. The part comprising the waveguide is not limited to the interior surface of the lens barrel, and also may include the exterior surface of the lens barrel, or may be a lateral surface or channel surface extending in the diameter direction and axial direction.

The lens driving actuator comprises a lens barrel having piezoelectric material extending at least in an axial direction, and the piezoelectric material is arranged so as to form a waveguide for propagating an elastic surface wave in the axial direction via excitation of the piezoelectric material. At least one venetian blind-like electrode and a high frequency wave power source for exciting the electrode are provided. The lens is pressed against the waveguide so as to be movable.

If the electrode is excited via a high frequency wave power source in the aforesaid construction, a lens pressed against the waveguide can be driven in the direction of propagation of the elastic surface wave, i.e., at least in one axial direction.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DESCRIPTION OF THE PREFERRED EMBODIMENTS

The preferred embodiments of a driving apparatus using the lens driving actuator of the present invention are described hereinafter with reference to the accompanying drawings.

Figure 3:
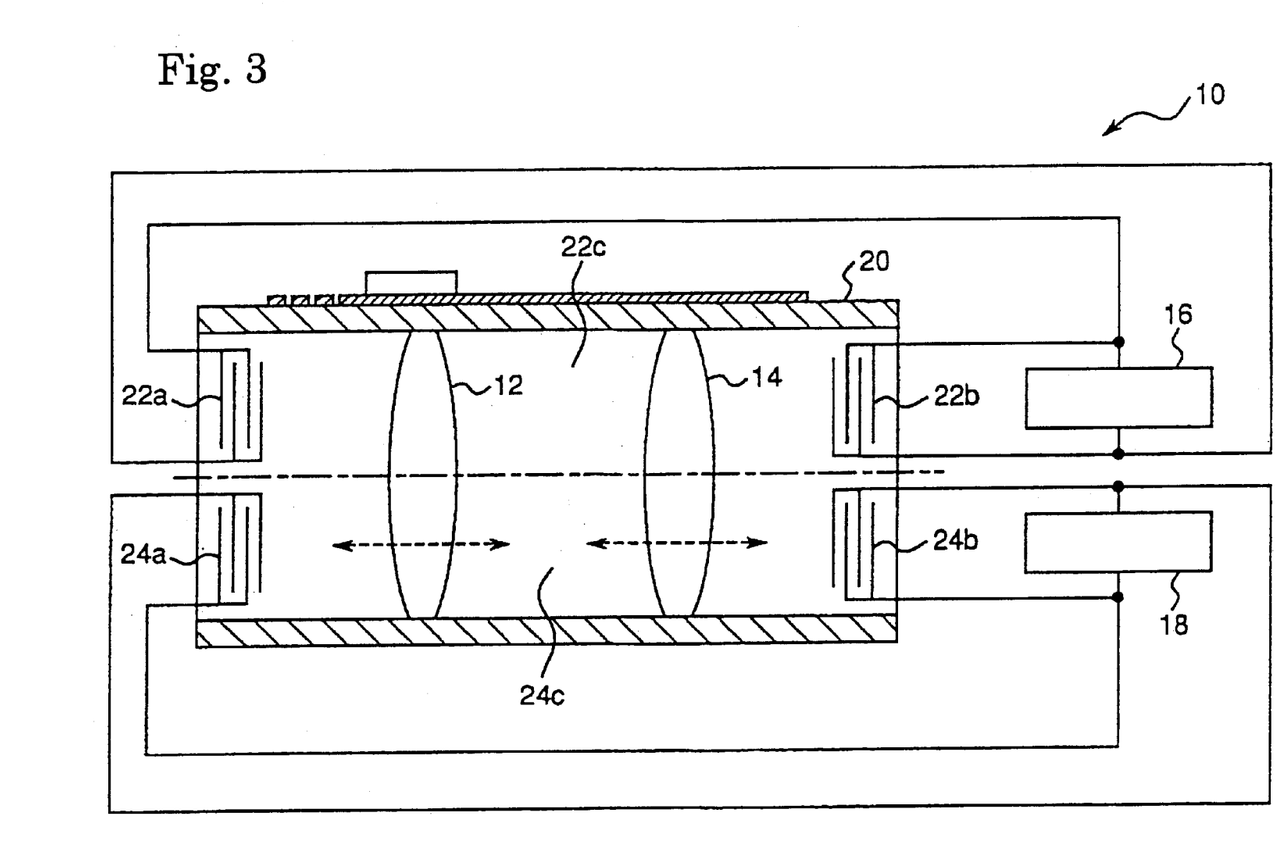
FIG. 3 is a cross sectional schematic view of the lens driving actuator of the present invention.

The lens apparatus 10 mainly comprises a lens barrel 20, a first lens 12, a second lens 14, and power sources of high frequency wave 16 and 18, as shown in the cross sectional schematic view of FIG. 3.

The lens barrel 20 is formed of piezoelectric material, and two pairs of venetian blind-like electrodes 22a, 22b, 24a, 24b are arranged opposite one another in the axial direction near the bilateral ends on the interior surface of the lens barrel 20. The first electrode pair 22a, 22b and the second electrode pair 24a, 24b are arranged shifted approximately 90 degrees in the circumferential direction. The first electrode pair 22a, 22b is electrically connected to a first high frequency wave power source 16, and the second electrode pair 24a, 24b is electrically connected to a second high frequency wave power source. When a high frequency voltage of the MHz order (e.g., approximately 10 MHz) is applied to the electrodes of either the electrode pair 22a, 22b, or the electrode pair 24a, 24b via the high frequency power sources 16 and 18, an elastic surface wave is generated in the interior surface of the lens barrel 20 and travels linearly in the axial direction. Accordingly, in the interior surface of the lens barrel 20 are formed waveguides 22c and 24c for propagating the elastic surface waves between the opposed electrodes 22a, 22b, or 24a, 24b. To switch the drive direction, a high frequency voltage may be applied to the other electrodes among the electrode pairs 22a, 22b, or 24a, 24b.

Figure 4A:
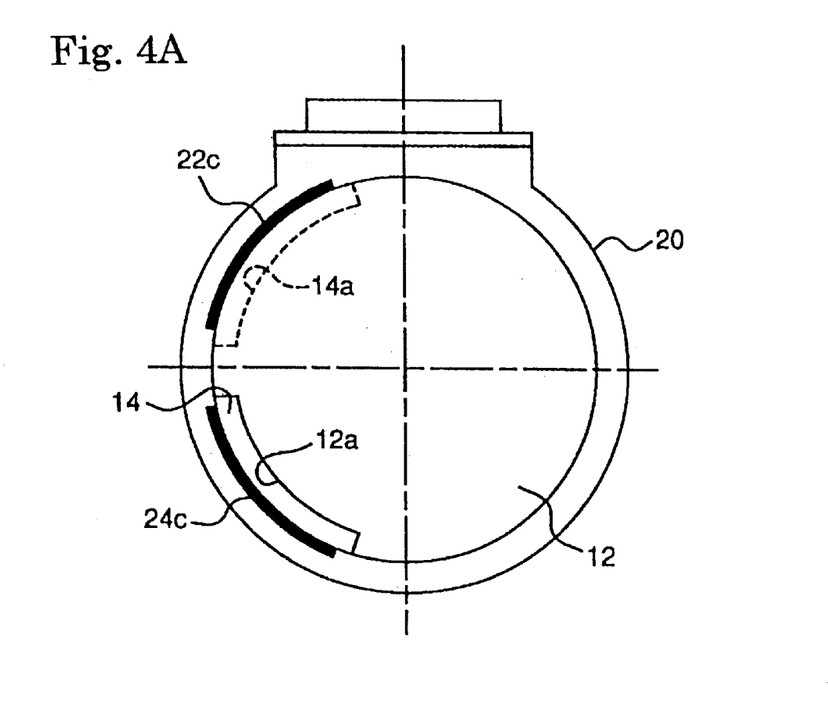
FIGS. 4A, 4B, and 4C are side views and section views of the lens driving actuator of FIG. 3.
Figure 4B:
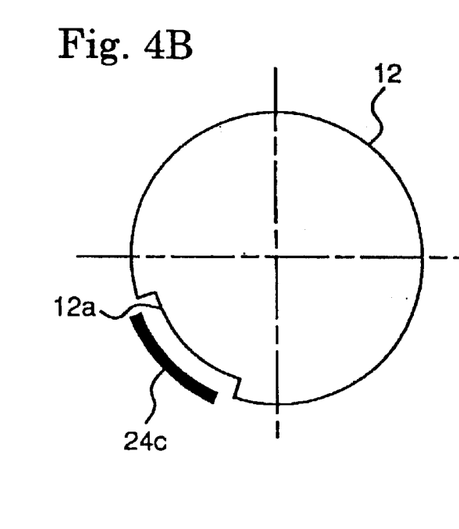
Figure 4C:
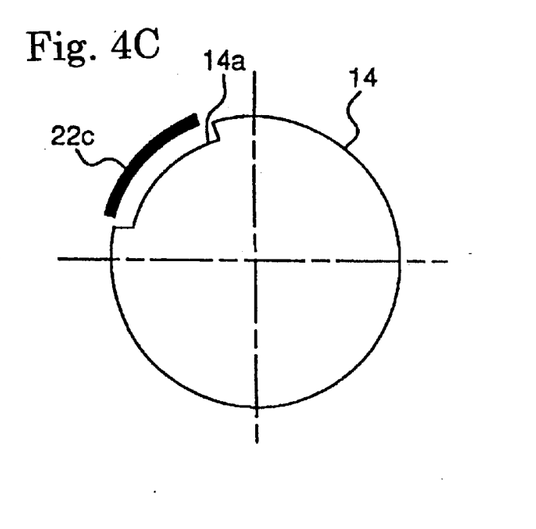

As shown in FIG. 4A, the exterior circumferential surfaces of the first lens 12 and the second lens 14 are respectively pressed against the interior circumferential surface of the lens barrel 20. Notches 12a and 14a are respectively provided on the exterior circumferential surfaces of the first lens 12 and the second lens 14, such that the first lens 12 is pressed against the waveguide 22c of the first electrode pair 22a, 22b but us not pressed against the waveguide 24c of the second electrode pair 24a, 24c, as shown in FIG. 4B; and the second lens 14 is pressed against the waveguide 24c of the second electrode pair 24a, 24b but is not pressed against the waveguide 22c of the first electrode pair 22a, 22b, as shown in FIG. 4C. Accordingly, only one lens 12 or 14 pressed against the waveguides 22c or 24c between the electrode pairs 22a, 22b or 24a, 24b is driven via an elastic surface wave when a high frequency voltage is applied to the first electrode pair 22a, 22b, or the second electrode pair 24a, 24b.

The method of manufacturing the lens barrel 20 is described with reference to FIGS. 5A, 5B, 5C, 5D, 5E, 5F, 5G, and FIG. 6.

Figure 5A:
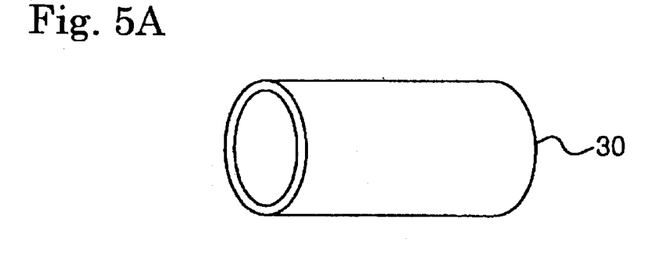
FIGS. 5A, 5B, 5C, 5D, 5E, 5F, 5G illustrate the process for manufacturing the lens driving actuator of FIG. 3.

As shown in FIG. 5A, first, a tube-like formed component 30 is formed. For example, a clay material comprising raw material powder of lead-zirconate-titanate (PZT), binder resin, dispersion agent and the like uniformly dispersed by mixing is formed in a tube using an extrusion device, and dried. In the present example, "MPT" agent manufactured by Hayashi Kagaku K. K., and having a relatively large mechanical quality coefficient so as to readily generate an elastic surface wave is used in the raw material powder of lead-zirconate-titanate.

Figure 5B:
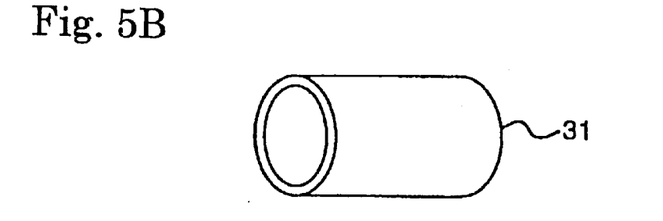

Then, as shown in FIG. 5B, the formed component 30 is placed in an oven and maintained at a temperature of 300 to 600° C. to evaporate the binder and the like. Thereafter, the temperature is elevated to 1000~1300° C. and the formed component is calcinated (sintering). The temperature conditions at this time may be modified in accordance with the combination of extruded materials used and the dimensions of the formed component. In the present example, the calcinated component 31 shrinks approximately 17%.

Figure 5C:
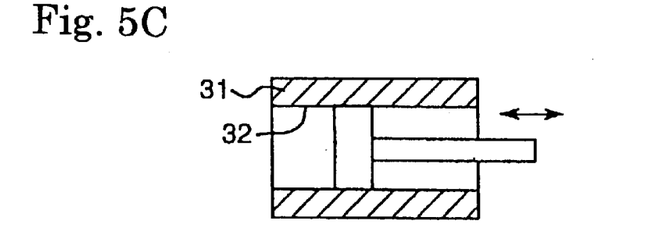

Thereafter, the internal surface 32 of the tube of the calcinated component 31 is lapped until a mirror surface is formed, as shown in FIG. 5C.

Figure 5D:
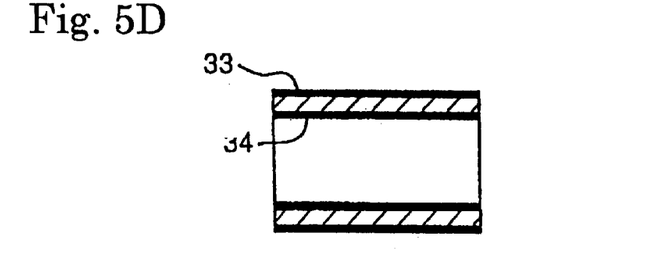

Next, the bilateral endfaces of the calcinated component 31 are masked, and the interior surface and the exterior surface are subjected to an electroless plating process to form plating layers 33 and 34, as shown in FIG. 5D. In the present example, "BEL NICKEL" fluid manufactured by Uemura Kogyo K. K. is used, and calcinates at 60° C. for 30~60 min to form nickel layers 33 and 34 approximately 1~3 µm in thickness. Copper layers may be formed rather than the nickel layers.

Figure 5E:
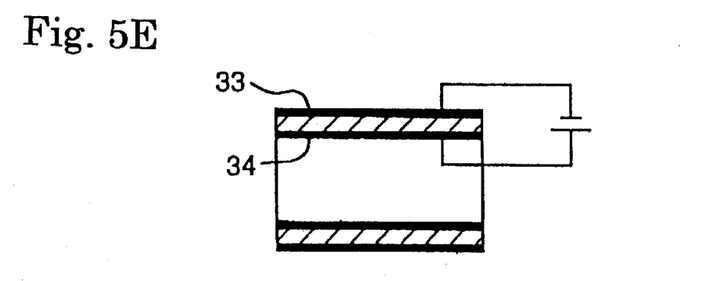

Then, as shown in FIG. 5E, the nickel layer 34 formed on the interior surface of the tube is designated the positive electrode, and the nickel layer 33 formed on the exterior surface of the tube is designated the negative electrode, and the component is baked in an oven at 100° C. and polarized at 2500 V/mm.

Figure 5F:
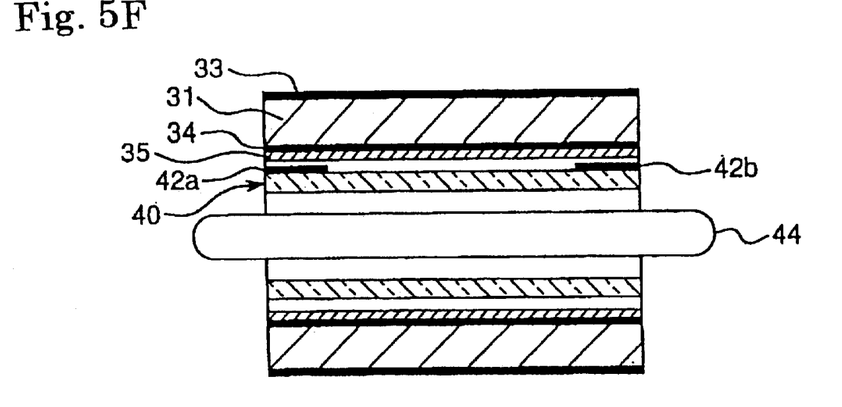

Then, as shown in FIG. 5F, a photoresist 35 is applied on the nickel layer 34 on the interior surface of the tube and dried, and thereafter a transparent glass tube 40 provided with mask patterns 42a and 42b is inserted into the interior surface of the tube, and optically exposed via a lamp 44. The transparent glass tube 40 is provided with the mask patterns 42a and 42b opposed in the axial direction near the bilateral ends of the exterior surface, as shown in the perspective view of FIG. 6. The mask patterns 42a and 42b are venetian blind-like such that the comb teeth mutually mesh, but the pitch of the comb teeth (blinds) desirably becomes finer as the drive frequency becomes higher. The external diameter of the transparent glass tube 40 is formed at a length equal to that of the calcinated component 31 so as to engage the internal diameter of the tube of the calcinated component 31.

Figure 5G:
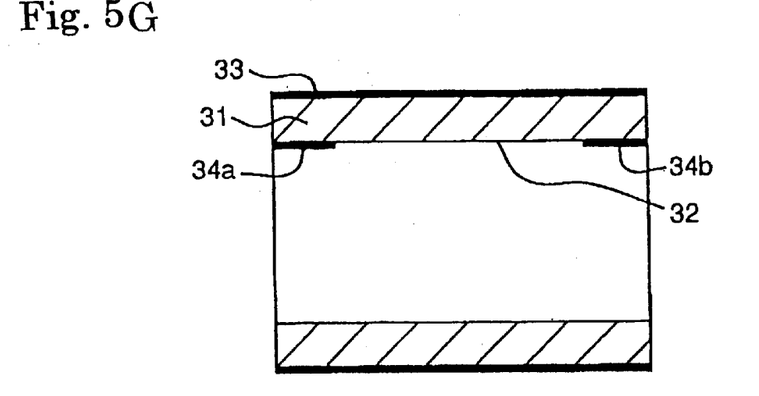
Figure 6:
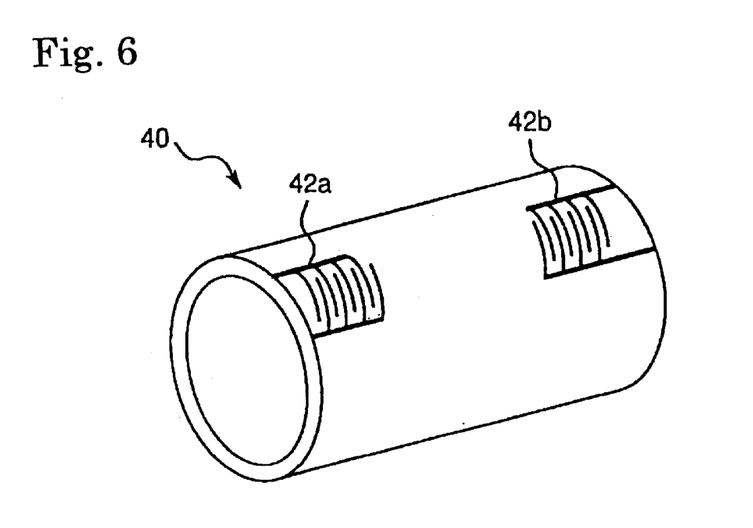
FIG. 6 is a perspective view of a transparent glass tube.

Then, the exposed photoresist 35 is developed, to form resist patterns of identical shape to the mask patterns 42a and 42b. These are etched, to form the nickel electrodes 34a and 34b on the interior surface of the tube. In this way, a drive source integrated with the lens barrel is formed, as shown in FIG. 5G.

As previously described, when a high frequency voltage of approximately 10 MHz is applied one or another of the electrodes 34a or 34b, an elastic surface wave is generated and forms a waveguide between the opposed electrodes 34a and 34b. When a lens is pressed against this waveguide with a suitable force, the lens is driven by the generated elastic surface wave. The voltage may be switched to the other electrode 34b or 34a to change the drive direction.

If two or more pairs of electrodes are formed and only one lens is pressed against the waveguide between each electrode pair, two or more lenses can be individually driven independently.

The specific construction for pressing a lens against the waveguide is described below with reference to FIGS. 7A–7C.

Figures 7A, 7B:
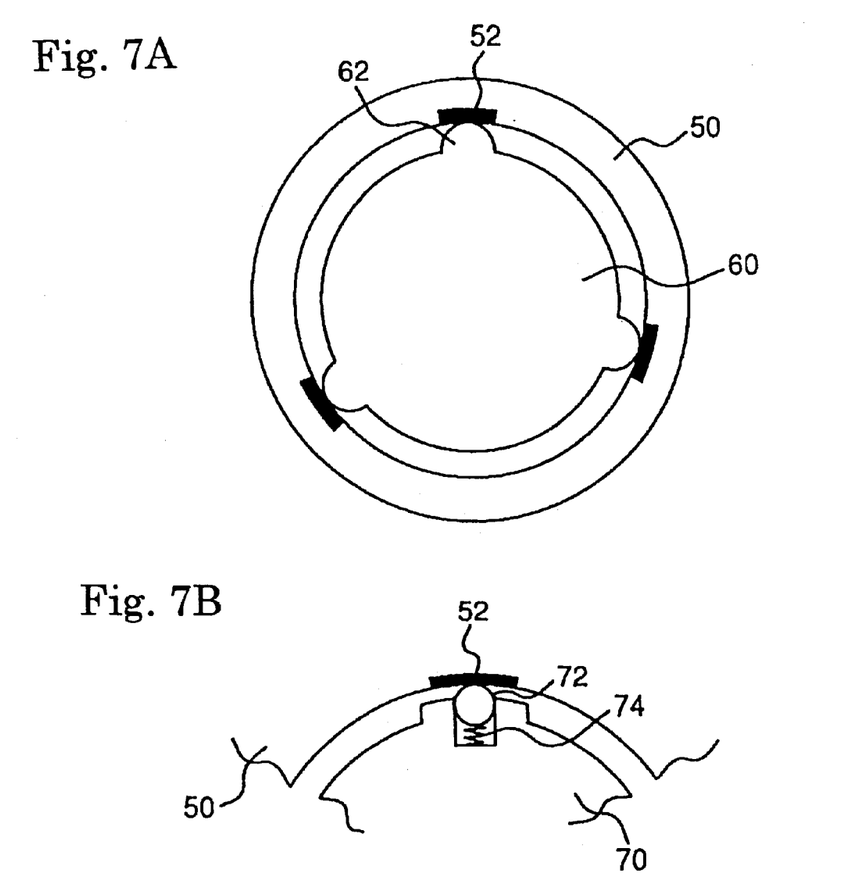
FIGS. 7A, 7B, 7C illustrate the pressure contact part.

A first construction is shown in FIG. 7A, wherein a lens 60 provided with a spherical projection 62 on its exterior surface engages the lens barrel 50, and the projections 62 of the lens 60 press against the waveguide 52 of the lens barrel 50 via the elasticity of the lens barrel 50 and the lens 60. In this example, if one lens is pressed against a plurality of waveguides 52, the lens can be driven with excellent balance and stability.

A second construction is shown in FIG lens barrel 50, an elastic ball 72 is pressed against the waveguide 52 of the lens barrel 50 using the elastic force of a spring 74.

Figure 7C:
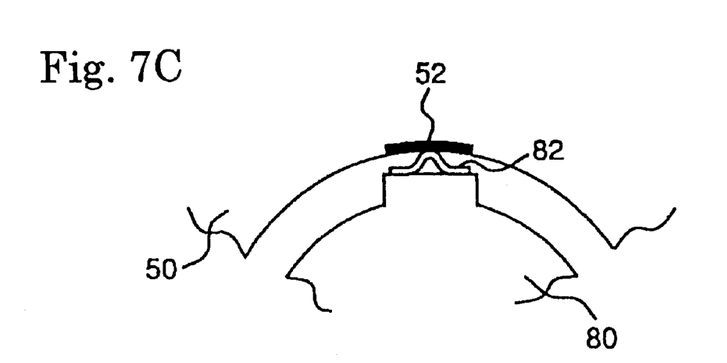

A third construction is shown in FIG. 7C, wherein a lens 80 is inserted into the lens barrel 50 and a projection 82 provided on the lens 80 is held by a spring force to the exterior surface, such that the projection 82 of the lens 80 is pressed against the waveguide 52 of the lens barrel 50.

As described above, the lens apparatus 10 using the lens driving actuator utilizing an elastic surface wave is capable of driving a lens via a simple construction.

The present invention is not limited to the previously described embodiments, and may be variously modified. For example, the lens barrel formed of piezoelectric material is not limited to having a circular or circular tube-like cross section inasmuch as the cross section may be a polygonal prism in configuration. The lens barrel also may have a divided shape. Not only may a lens be driven, but also optical members such as a prism, mirror and the like. Components other than optical members may be driven insofar as such components are driven in a predetermined direction within a tube shape.

Although preferred embodiments of the invention have been described in the foregoing detailed description and illustrated in the accompanying drawings, it will be understood that the invention is not limited to the embodiments disclosed, but is capable of numerous rearrangements, modifications and substitutions of parts and elements without departing from the spirit of the invention. Accordingly, the present invention is intended to encompass such rearrangements, modification and substitutions of parts and elements as fall within the spirit and scope of the invention.

What is claimed is:

1. A driving apparatus comprising:

a barrel formed of piezoelectric material and having an interior surface;

an electrode pair opposed to the surface of the barrel and forming a waveguide between the electrode pair on the interior surface of the barrel; and a driven member movably supported in the barrel and pressing against the waveguide.

2. The driving apparatus according to claim 1, wherein said driven member includes a lens and the driven member is driven along the axial direction of the lens.

3. The driving apparatus according to claim 1, further comprising:

a power source applying an electric power to the electrode pair.

4. The driving apparatus according to claim 3, wherein said power source supplies a high frequency wave.

5. The driving apparatus according to claim 4, wherein said high frequency wave formed sawtooth-pulse.

6. The driving apparatus according to claim 1, wherein said driven member is frictionally engaged with the waveguide.

7. The driving apparatus according to claim 6, further comprising:

a spring member pressing a driven member against the waveguide.

8. The driving apparatus according to claim 1, wherein the piezoelectric material has a polycrystalline structure.

9. A driving apparatus comprising:

a barrel formed of piezoelectric material;

a first electrode pair opposed to the surface of the barrel and forming a first waveguide between the first electrode pair on the interior surface of the barrel;

a second electrode pair opposed to the surface of the barrel and forming a second waveguide between the second electrode pair on the interior surface of the barrel;

a first driven member movably supported in the barrel and pressing against the first waveguide; and a second driven member movably supported in the barrel and pressing against the second waveguide.

10. The driving apparatus according to claim 9, wherein the first and second electrode pairs are arranged that the first and second waveguides are staggered each other.

11. A method for making a drive unit, the method comprising the steps of:

forming a barrel from raw powder of piezoelectric material and binder resin;

sintering the barrel;

lapping the internal surface of the barrel; and forming an electrode pair opposed to the surface of the barrel.

12. The method according to claim 11, wherein the electrode pair forming step includes an electroless plating process.

13. The method according to claim 11, further comprising the steps of:

arranging a driven member into the barrel, wherein the driven member presses a waveguide formed between the electrode pair.

* * * * *